United States Patent [19]

Ferguson et al.

[11] Patent Number: 4,595,649
[45] Date of Patent: Jun. 17, 1986

[54] GLASSY TIO$_2$ POLYMER FILMS AS ELECTRON BEAM CHARGE DISSIPATION LAYERS

[75] Inventors: Susan A. Ferguson, W. Seneca; Roland L. Chin, Williamsville, both of N.Y.

[73] Assignee: Allied Corporation, Morris Township, Morris County, N.J.

[21] Appl. No.: 703,058

[22] Filed: Feb. 19, 1985

[51] Int. Cl.$^4$ .................................................. G03C 5/00
[52] U.S. Cl. ..................................... 430/296; 430/942; 250/492.2; 250/492.3; 427/38
[58] Field of Search ................ 430/296, 942, 312, 394, 430/271, 273, 523, 525; 250/492.2, 492.3; 427/38

[56] References Cited

U.S. PATENT DOCUMENTS

| | | | |
|---|---|---|---|
| 3,940,507 | 2/1976 | Fech et al. | 427/43 |
| 4,403,151 | 9/1983 | Mochiji et al. | 250/492.2 |
| 4,524,126 | 6/1985 | Marinace et al. | 430/311 |

FOREIGN PATENT DOCUMENTS 54-162460 12/1979 Japan .................................. 430/314

OTHER PUBLICATIONS

G. R. Brewer, Electron Beam Tech. in Microelectric Fabrication, Academic Press, NY 1980, pp. 226–227.
Titanium Dioxide Antireflection Coating for Silicon Solar Cells by Spray Deposition—RCS Review, vol. 41 (1980), p. 133, et seq.

Primary Examiner—Roland E. Martin
Assistant Examiner—José G. Dess
Attorney, Agent, or Firm—Arthur J. Plantamura; Jay P. Friedenson

[57] ABSTRACT

The use of TiO$_2$ spin-on glass films for reduction of electrostatic charging of a semiconductor substrate upon electron beam exposure is described. Specifically, the disclosure relates to electron beam lithographic processing during semiconductor device or mask fabrication. The TiO$_2$ glass films may also be utilized for charge dissipation during ion implantation. A thin TiO$_2$ composition spin-on glass film is used as a charge dissipation layer. This mechanism is effective as a resolution enhancement mechanism during electron beam or ion beam processing of semiconductors. The TiO$_2$ composition films are prepared from spin-on materials that consist of partially hydrolyzed organotitanium species dissolved in organic solvents which produce glassy films of TiO$_2$ upon application to silicon and other substrates and subsequent heating. The films are completely amorphous, have extremely low pinhole and particulate densities, are uniform in thickness and free of radial striations. These spin-cast films do not exhibit the moisture sensitivity typical of TiO$_2$ produced from other liquid sources.

6 Claims, No Drawings

GLASSY TIO₂ POLYMER FILMS AS ELECTRON BEAM CHARGE DISSIPATION LAYERS

This invention relates to a method for dissipating electrostatic charges on a semiconductor substrate during electron or ion beam exposure in the manufacture of semiconductor components and more particularly to the use of $TiO_2$ preferably as spin-on glass films for reduction of electrostatic charging of a semiconductor substrate upon electron beam exposure. Specifically, the invention is directed toward applications related to electron beam lithographic processing during semiconductor device or mask fabrication. Additionally, the $TiO_2$ glass films described by the present invention may be utilized advantageously for charge dissipation during ion implantation.

BACKGROUND OF THE INVENTION

Electron beam lithography is a process used in microelectronics fabrication technology for the generation of very small features and patterns which eventually become electrical devices and circuits. Pattern definition results from the interaction of a fine beam of electrons with an electron beam resist which alters the solubility properties of the electron beam exposed areas. Development of the desired pattern is normally accomplished with organic solvents. Typical resist compositions used in the lithographic process are organic polymers owing to their ability to undergo molecular cross-linking (negative resist) or chain-scission (positive resist) during electron irradiation. As a consequence of the resist's insulating properties, charge build-up occurs upon electron beam exposure. This "charging effect" is detrimental since it may cause defocussing of the incident electron beam with a subsequent loss in pattern resolution. In order to circumvent this problem, it is necessary to dissipate or neutralize the excess charges. In the prior art, charge dissipation has been described often as being effected by applying a thin conducting film either on top of or below the resist layer. Such as described, for example, in U.S. Pat. No. 3,940,507. This operation is described also in *Electron-Beam Technology*, A. R. Brewer, Academic Press, New York, 1980, pp. 226-227. Specimen clamps are used to provide a discharge path to ground. Typically, gold or aluminum at a thickness of a few hundred angstroms is employed. Before development of the pattern, this metallic film must be removed.

The deposition of the metallic film is generally accomplished by evaporation or sputtering of an appropriate target. Whether the conductive film is placed above or below the resist layer, transport of the processed sample from the resist coater to the metal deposition chamber (or vice versa) is necessary. This extra handling step is detrimental to good yields. Moreover, removal of the metallic film may involve chemicals not normally used in semiconducting processing; thus, contributing to an additional source of contamination.

The problem of electrostatic charging also exists for ion implantation of dopants (e.g. boron or phosphorus). However, in this case positive charges are deposited into the sample. Due to the electrical imbalance resulting from this charge accumulation, electron conduction is necessary in order to maintain neutrality. If this is not possible due to the insulating properties of the substrate, a net electrical potential is obtained which, as in electron beam lithography, results in good resolution limitations and alterations of MOS gate electrical properties and performance.

Accordingly, a need exists for a technique that obviates the disadvantages attendant in the dissipation of charges build up from electron beam exposures in semiconductor manufacture and/or a procedure that reduces the accumulation of electrostatic charges.

SUMMARY OF THE INVENTION

The invention involves the use of $TiO_2$ glassy polymer films in the fabrication of integrated semiconductor circuits. The $TiO_2$ glassy films are employed in reducing the electrostatic charging of the semiconductor substrate during electron beam exposure in electron beam lithography and during dopant ion bombardment in the ion implantation doping process.

The invention employs a thin spin-on $TiO_2$ type glass film as a charge dissipation layer. The utility of the process involves resolution enhancement during electron beam or ion beam processing of semiconductors.

The $TiO_2$ glassy films used in the invention may be prepared by known techniques or from commercially available titanium containing spin-on materials. The methods for preparation of such material are disclosed in the RCA Review, Vol. 41, No. 2 June 1980 page 133 et seq. and or may be obtained commercially such as the material available as ACCUGLAS TM 900 from Allied Corporation. These products consist of partially hydrolyzed organotitanium species dissolved in organic solvents which produce glassy films of $TiO_2$ upon application to silicon and other substrates and subsequent heating. The films are completely amorphous, have extremely low pinhole and particulate densities, are uniform in thickness and free of radial striations. Such spin-cast films do not exhibit the moisture sensitivity typical of $TiO_2$ produced from other liquid sources.

The recommended method of application is spin-casting followed by a thermal cure. Optimum film thickness will be dictated by the process for which the charge dissipation is necessary. Thinner films may be obtained by increasing the spin speed and/or dilution of the starting solution with organic solvents such as acetone, ethyl acetate or isopropyl alcohol. Removal of the cured $TiO_2$ film is easily accomplished by suitable means such as by a one minute dip in 1% HF.

DESCRIPTION OF THE PREFERRED EMBODIMENTS

In accordance with the invention a $TiO_2$ glassy polymer is utilized as a thin layer, preferably as a spin-on glassy film in the fabrication of integrated semiconductor circuits. Specifically, the spin-on glass films function to reduce electrostatic charging of a semiconductor substrate during electron beam exposure in electron beam lithography and during dopant ion bombardment in the ion implantation doping process.

The applied $TiO_2$ glassy film performs as a charge dissipation layer. The utility of this invention is important in affording resolution enhancement during electron beam or ion beam processing of semiconductors.

The $TiO_2$ films useful herein may be prepared as described in the aforementioned RCA Laboratories publication, RCA Review Vol 41, or from spin-on materials that are available commercially. These products consist of partially hydrolyzed organotitanium species dissolved in organic solvents which produce glassy films of $TiO_2$ upon application to silicon and other substrates and subsequent heating. The films are completely amorphous, have extremely low pinhole and particulate densities, are uniform in thickness and free of radial striations. Most importantly, spin-cast films do not exhibit the moisture sensitivity typical of $TiO_2$ produced from other liquid sources.

The solutions used to generate the films are preferably applied by spin-casting followed by a thermal cure. Optimum film thickness is dictated by the process for which the charge dissipation is necessary. The film thickness as a function of spin speed is given hereinbelow in Table I for the commercially available organotitanium solution known as ACCUGLASS TM Ti-900. Thinner films may be obtained by increasing the spin speed and/or dilution of the starting solution with organic solvents such as acetone, ethyl acetate or isopropyl alcohol. Removal of the cured $TiO_2$ film is easily accomplished by a one minute dip in 1% HF.

TABLE I

| Film Thickness as a Function of Spin Speed for ACCUGLASS TM Ti-900 | |
|---|---|
| Speed (rpm) | Thickness, Å (200° C., 10 min. cure)* |
| 2000 | 1100 |
| 3000 | 900 |
| 4000 | 740 |
| 5000 | 670 |

*Each value shown represents the average of 5 measurements taken at different points on a 3 inch wafer. The standard deviation in each case was less than 2%.

The invention which involves a novel means of dissipating electronic charges on a semiconductor during electron or ion beam exposure in semiconductor manufacturing will be further described by the following specific examples. It will be understood, however, that although these examples may describe in detail certain preferred operating conditions of the invention, they are given primarily for illustrative purposes and the invention in its broader aspects should not be limited thereto.

EXAMPLE 1

Comparisons of the relative degree of charging among different materials was determined by Auger Electron Spectroscopy (AES). Thin films of the material in question coated over a silicon substrate were subjected to electron bombardment at an energy of 5 KeV and beam current of 50 nA. The sample was positioned so that the trajectory of the incident electron beam was normal to the sample surface. The intensity of secondary electron emission was then measured as a function of kinetic energy for different materials and the onset energies were determined. This value contains contributions due to work function of the sample and the charging potential. Since the substrate is in electrical contact with the AES spectrometer, it will take on the work function of the spectrometer. Hence, the work function of any material analyzed will be constant and differences in the energies of the emitted secondary electrons will depend solely on the charging potential.

Samples of substrates with various over layers were prepared by spin-coating a one micron thick layer of commercial photoresist compositions on a clean silicon wafer and soft baking at 90° C. for 30 minutes. The photoresist was patterned using a resolution target mask and developed. This sample was used to obtain baseline data pertaining to the charging properties of bare photoresist.

Subsequent samples were prepared by flood exposing the above prepared samples for 4 hours to UV light to prevent reflow of the photoresist during the thermal cure of the spin-on glass. A 1000 Å layer of spin-on $SiO_2$ (ACCUGLASS TM -203, Allied Chemical) or spin-on $TiO_2$ (ACCUGLASS TM Ti-900) was applied on top of the resist and cured at 200° C. for 20 minutes.

The degree of charging as measured by the kinetic energy at onset of secondary electron emission is given in Table 2. For reference, data on bulk gold, pyrex glass and polytetrafluoroethylene are included.

The data showns that the electrostatic charging is reduced by application of a $TiO_2$ film over photoresist relative to bare photoresist. Additionally, spin-on $TiO_2$ is found to be a much better charge dissipator than spin-on $SiO_2$.

TABLE 2

| Sample | Kinetic Energy at Onset of Secondary Electron Emission (eV) |
|---|---|
| bulk gold | 4 |
| $TiO_2$ on photoresist | 30 |
| $SiO_2$ on photoresist | 62 |
| bare photoresist | 76 |
| Pyrex Glass | 600 |
| Polytetrafluoroethylene[a] | — |

[a]No secondary electron emission observable due to severity of charging.

EXAMPLE II

Electrical measurements were conducted or samples prepared in Example I, the results indicate that the resistivity of a cured $TiO_2$ spin-on film is of the order of $10^2$ ohm-cm. Compared to a typical value of $10^{16}$ ohm-cm for resist, the $TiO_2$ film is a much better electrical conductor.

EXAMPLE III

In an effort to obtain a secondary electron image on a semiconductor substrate patterned with photoresist, the patterned substrate prepared as described in Example I was subjected to an electron beam and compared with an uncoated substrate. A 30 KeV electron beam at a normal incident angle was used. Secondary electron images of uncoated, patterned photoresist were not observable at a magnification of 1000X. However, with application of a 1000 Å layer of spin-on $TiO_2$ glass on top of the photoresist as described in Example I, the pattern could be easily delineated.

When using ion beam exposure, the substrate has been prepatterned with a photoresist. Thereafter, the $TiO_2$ film is applied to the patterned substrate and subjected to the ion beam radiation. The ions selectively are implanted into those areas of the substrate as defined by the patterned photoresist. The $TiO_2$ film is then stripped off and the substrate is further processed in semiconductor manufacturing sequence.

It will be understood that within the scope of the invention as herein described, variations may be made in details provided. Accordingly, the invention should not be limited to such details except as set forth in the appended claims.

What is claimed is:

1. In a method for the manufacture of a semiconductor device in which a spin on resist layer is applied to the device substrate, wherein the substrate is exposed to charged particles to generate a pattern on the substrate and wherein the resist layer is developed, the improvement comprising:

(a) applying to the substrate by spin-on deposition, a layer of $TiO_2$ glassy polymer composition; and (b) exposing the thus coated semiconductor substrate to a beam of charged particles.

2. The method of claim 1 wherein the substrate is exposed to an electron beam.

3. The method of claim 2 wherein the resist is applied to the substrate after the $TiO_2$ glassy polymer layer.

4. The method of claim 2 wherein the electron beam resist is applied to the substrate before the $TiO_2$ glassy polymer layer.

5. The method of claim 1 wherein the $TiO_2$ layer is exposed to ion beam radiation.

6. In a method for the manufacture of a semiconductor device in which a spin on resist layer is applied to the device substrate, wherein the substrate is exposed to charge particles to generate a pattern on the substrate and wherein the resist layer is developed, the improvement comprising:
  (a) applying to the substrate by spin-on deposition, a layer of $TiO_2$ glassy polymer composition;
  (b) exposing the thus coated semiconductor substrate and resist to electron beam radiation to generate a pattern on the substrate; and
  (c) thereafter developing the pattern.

* * * * *